United States Patent

[11] 3,615,875

[72] Inventors Todahisa Morita Mitaka-shi; Takashi Tokuyama, Hoya-shi; Takashi Tsuchimoto, Kodaira-shi; Takao Miyazaki, Hachioji-shi; Shigeru Nishimatsu, Tokyo; Takahide Ikeda, Kokubunji-shi; Hisumi Sano, Tokyo; Masatada Horiuchi, Koganei-shi, all of Japan

[21] Appl. No. 861,823
[22] Filed Sept. 29, 1969
[45] Patented Oct. 26, 1971
[73] Assignee Hitachi, Ltd. Tokyo, Japan
[32] Priority Sept. 30, 1968
[33] Japan
[31] 40/70136

[54] METHOD FOR FABRICATING SEMICONDUCTOR DEVICES BY ION IMPLANTATION
5 Claims, 6 Drawing Figs.

[52] U.S. Cl. .......... 148/1.5, 29/576, 29/578, 148/186, 148/187
[51] Int. Cl. .......... H01l 7/54
[50] Field of Search .......... 148/1.5, 186, 187; 29/576, 578

[56] References Cited

UNITED STATES PATENTS

| | | | |
|---|---|---|---|
| 3,523,042 | 8/1970 | Bower et al. | 148/1.5 |
| 3,533,857 | 10/1970 | Mayer et al. | 148/1.5 |

*Primary Examiner*—L. Dewayne Rutledge
*Assistant Examiner*—R. A. Lester
*Attorney*—Craig, Antonelli, Stewart & Hill

ABSTRACT: A semiconductor body acting as a collector is directed at a predetermined surface area by an inert ion beam from such a direction as not to produce a channeling effect in the body, whereby obtaining an amorphous surface region thereat, then directed at a larger surface area including said predetermined surface area by an active impurity ion beam of the conductivity type opposite to said body from a direction producing the channeling effect in the body, thereby obtaining a base region in the semiconductor body with a PN junction therebetween which has a partial projection in its bottom part, and further directed at said predetermined surface area by an active impurity ion beam of the same conductivity type as that of the body from the channeling-effect-providing direction, thereby obtaining an emitter region, and finally heat-treating, so that a transistor without defects due to the emitter dip effect is obtained.

INVENTORS
TADAHISA MORITA, TAKASHI TOKUYAMA,
TAKASHI TSUCHIMOTO, TAKAO MIYAZAKI,
SHIGERU NISHIMATSU, TAKAHIDE IKEDA,
HISUMI SANO and MASATADA HORIUCHI
BY
Craig, Antonelli, Stewart & Hill
ATTORNEYS

METHOD FOR FABRICATING SEMICONDUCTOR DEVICES BY ION IMPLANTATION

BACKGROUND OF THE INVENTION

1. Field of the Invention

The present invention relates to a method for forming a PN-junction by ion implantation, and more particularly to a method for fabricating a semiconductor device employing such a PN-junction.

2. Description of the Prior Art

It is known that the ion implantation is a promising method to form a PN-junction in a semiconductor single crystal body by adding an active impurity such as phosphorus to boron at a certain surface region of the body. According to this method, an active impurity which is capable of providing a predetermined conductivity-type region in the body and which is selected from the group of III–V elements in the periodic table, is ionized and accelerated by an accelerator into the form of an ion beam of a high energy to impinge a semiconductor body whereby physically implanting the impurity into the semiconductor body. This manner is disclosed in U.S. Pat. No. 2,787,564 to Shockley et al. and U.S. Pat. No. 2,842,466 to James W. Mayer.

This method has the following advantages: that the concentration and the distribution of the injected impurity can be controlled arbitrarily by controlling the energy of the ion beam so that a long heat treatment as required conventionally for thermal diffusion is not required; and that it facilitates formation of a conductivity region of less than 1$\mu$ depth whereas the formation of such a thin region has been difficult in the conventional thermal diffusion method.

One of the techniques required for applying the ion implantation method into practical manufacture of a semiconductor device is to form in the semiconductor body a PN-junction having a partial projection. This technique obviates the emitter dip phenomenon which is troublesome in, for example, a high-frequency transistor.

The emitter dip phenomenon appears when a semiconductor body (acting as the collector of transistor) in which ions for forming the base and emitter regions of the transistor have previously been implanted is annealed in order to eliminate the defects caused by the ion implantation, and this phenomenon is represented by the dip of the base region at a part thereof underneath the emitter region into the collector region so that the PN-junction between the base and collector regions is provided with a partial hollow.

Once the emitter dip phenomenon appears, the reduction of the base width becomes difficult. If, on the other hand, the emitter region is formed deeper in the base region to reduce the base width, the base region presents an extremely narrow width at its hollow edge resulting in an increase in the base resistance. Thus, the characteristics of the transistor are deteriorated, and their control becomes difficult.

The above shortcomings can be solved by forming the base region in such a manner that its portion in which the emitter region will be formed is previously projected toward the emitter so that the transformation of the base region due to the emitter dip appears only in the projected portion.

SUMMARY OF THE INVENTION

Accordingly, the primary object of the present invention is to provide a method for forming a PN-junction having at least one partially projected area or partial projection in the semiconductor body by applying the ion plantation.

Another object of the present invention is to provide a method for forming a transistor device without the defects due to the emitter dip phenomenon.

In order to attain the above objects the present invention utilizes the following three properties of the ion implantation.

The first property of said ion implantation is that since the injection depth of the implanted ions within a semiconductor single-crystal body depends upon the selected orientation of the crystal face of a semiConductor single-crystal body as well as the angle of incidence of the ion beam with respect to said crystal face, ions are injected deeper only when the injection is carried along a limited angle of incidence in which lattice atoms of the semiconductor single-crystal body than in the other directions even if their energies are the same. In this specification, this property is referred to as the channeling effect and such specific angle of incidence is referred to as a channeling angle.

The second property is that if the ion implantation is performed at an angle other than the channeling angle, which is referred to as unchanneling angle, the collision between the injected ions and the crystal lattice atoms occurs with a high probability. The lattice arrangement in the crystal is thus disordered and a thin amorphous region is formed in the surface portion of the body.

The third property is that the injection depth of the ions implanted into the semiconductor body differs depending on the crystal condition in the surface portion of the semiconductor body. Namely, ions implanted onto the surface having an amorphous or crystal lattice disordered region is less injected than when it is implanted onto the surface having normal lattice arrangements.

The gist of the present invention is based on the previous formation of a thin amorphous layer in the surface of a semiconductor body of one conductivity type by injecting ions into a first predetermined region of the surface at an unchanneling angle. In this case, an inert element giving no change in the conductivity to the semiconductor body is used for the ion implantation.

Next, in a second predetermined region having a wider area and laterally containing the above amorphous layer, ions of active impurity of the opposite conductivity type to that of the body are injected at a channeling angle. Thus the impurity ions are shallowly implanted just under the first predetermined region while deeply in the peripheral portion around the first region, so that a PN-junction having a partially projected area is obtained.

In more detail, the most remarkable channeling effect is obtained in the [110] face of a silicon single crystal since the crystal lattice space is the largest therein along the channeling angle, whereby deeper ion injection is readily done in this crystal face than in other faces. Although the channeling effect slightly differs with the kind of implanted ions and the energy of ion beam, the channeling effects can take place within about 3° from a perpendicular with respect to the crystal surface if the beam energy is 100 to 200 Kev. When the deviation angle from the perpendicular exceeds 7°, the injection depth is practically decreased and so, the angle exceeding 7° is considered to be unchanneling angle. The channeling effect is expected to occur also in the [111] and [100] faces, but the effect is weaker in comparison with that of the [110] face.

The description will be hereinafter made first to show a conventional method and then to show the present inventive method.

DESCRIPTION OF THE PREFERRED EMBODIMENTS

Figure 1:
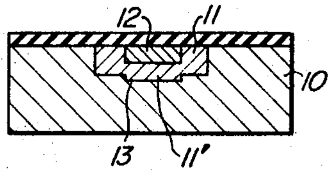
FIG. 1 PRIOR ART
FIG. 1 is a cross-sectional view of a transistor produced by a prior art method.

As shown in FIG. 1, according to a prior art method a base region 11 is formed in a semiconductor body 10 and then an emitter region 12 is formed in the base region, and thereafter heat treatment is adopted, so that a portion 11' of the base region 11, just under the emitter region 12 is pressed down into the body 10 which is namely a collector region. Consequently a PN-junction 13 having a partial hollow area is obtained between the base and the collector. The emitter dip appearing in the ion implantation is of the order of 0.1 $\mu$ when the depth of the base region 11 and the emitter region 12 are 0.5 $\mu$ and 0.3 $\mu$ respectively.

Figure 2:
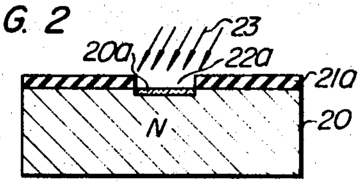
FIGS. 2 to 6 are cross-sectional views of a transistor in each manufacturing process according to one embodiment of the present invention.

The description will then turn to one embodiment of this invention. FIG. 2 shows a process of forming a thin amorphous layer 20*a* on a surface portion of an N-type silicon single crystal body 20 by injecting inert ions. The surface of said body has the [110] crystal face as its principal surface and the silicon body serves as the collector region of a transistor. The injection of the inert ions into the body is carried out after a mask 12*a* having an aperture 22*a* whose area is equal to or preferrably a little larger than that of the emitter region is provided on one surface of the silicon body 20 at an unchanneling angle, i.e. at an angle more than 7° away from the perpendicular to the surface of the body as indicated by the arrows 23. As the inert ions an element having no influence on the conductivity of the body 20, e.g. argon, is used and injected in the form of an ion beam with 50 to 100 Kev. into the body so that the argon ions reach about 0.2 $\mu$ deep in accordance with the shape of the aperture 22*a* of the mask formed on the surface portion of the body, thereby forming an amorphous layer 20*a* with a disordered crystal body.

Figure 3:
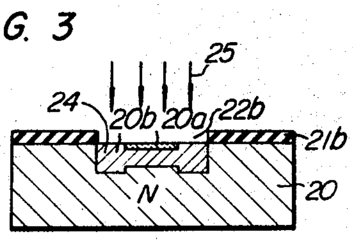

FIG. 3 shows processes of providing on the body 20 a mask 21*b* having an aperture 22*b* which corresponds to the shape of a base region 24 to be formed and which is large enough to surround the amorphous layer 20*a* and then injecting through the mask 21*b* a P-type impurity, e.g. boron, into the surface portion of the silicon body 20 exposed by the aperture 22*b*, to thereby obtain the base region 24. The implantation of boron is made at a channeling angle, e.g., such a direction perpendicular to the surface of the body as indicated by the arrow 25. The ion beam of boron has an energy of about 150 to 180 Kev. In the region 20*b* wherein the crystal lattices are aligned in order along the channeling direction, borons are deeply injected due to the channeling effect, so that a P-type region with a depth of about 0.5 $\mu$ is formed, while in the amorphous layer 20*a* the injection depth of the injected borons can be shallower due to the disorder of the lattice atoms in the amorphous layer. Therefore, the PN junction formed between the base region 24 and the collector region 20 has a partially projecting or shallow area in the center portion thereof but a deep area in the periphery thereof.

Figure 4:
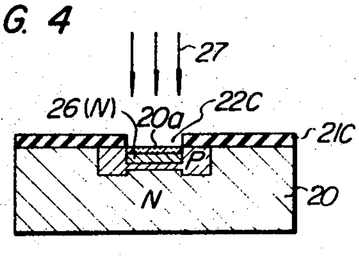

FIG. 4 shows a process of injecting an N-type impurity, e.g. phosphor, into the surface of the silicon body 20 through a mask 21*c* having an aperture 22*c* and formed on the body. The aperture 22*c* is so formed to position on the amorphous layer 20*a*, that an emitter region 26 may be formed by injecting phosphor ions in the form of a beam having an energy of about 200 Kev. at a channeling angle perpendicular to the surface of the body as indicated by the arrows 27, whereby the emitter region 26 is superposed upon the amorphous layer 20*a* having a depth of 0.3 $\mu$.

Figure 5:
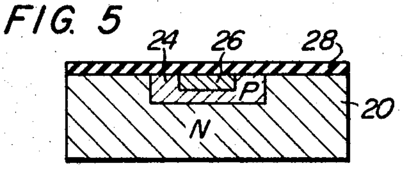

FIG. 5 shows a process of annealing the thus-produced silicon body in order to eliminate any damages caused in the silicon body by the implantation of several kinds of ions and also to remove the amorphous layer 20*a*. The annealing is done at about 500° C. By the heat treatment of the silicon body 20 at 800° C. for a few hours, the damages and the amorphous layer 20*a* are removed.

During the annealing step, a part of the base region just underneath the emitter region 26 is pushed toward the collector due to the heat treatment in the same manner as seen in the prior art method. However, according to the present invention, since the center portion of the base region which corresponds to the portion underneath the emitter region is preliminarily formed shallower than the peripheral portion, after the annealing process the center portion of the base region under the emitter region is still shallower than or substantially equal to the peripheral portion as shown in FIG. 5. Here, in view of the passivation of the surface of the body it is desirable to remove the mask 21*c* after the emitter impurity is injected and then to deposit a new silicon dioxide ($SiO_2$) insulating film 28 by thermal decomposition of monosilane at a temperature from about 500° C. to 800° C. for scores of minutes.

And the annealing step of the present invention is preferrably included in the thermal decomposition step.

Figure 6:
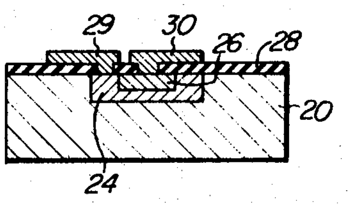

FIG. 6 shows a transistor structure thus obtained. The conventional photoetching technique is applied to the protective insulating film 28 to form holes for exposing a portion of the base region 24 and the emitter region 26. Thereafter, a base electrode 29 and an emitter electrode 30 are formed in these holes.

In the above embodiment, the masks 21*a*, 21*b* and 21*c* used for defining the regions to which ions are implanted may be a silicon dioxide ($SiO_2$) film, a silicon nitride film or a metal film capable of interrupting the pass of ions therethrough and preferrably coated on the surface of silicon body 20. The aperture 22*a*, 22*b* and 22*c* are all formed by the well-known photoetching technique. Since the ion beam has property of advancing as straight as a light beam, a silt or slits provided apart from the surface of the body can also substitute for these apertures.

As described above, according to the present invention, a thin amorphous layer is preliminarily formed on a surface portion of the silicon body to reduce the channeling effect of the implanted ions. Thus, even if the beam energy of the active impurity ions is the same, a PN-junction having different depths can be formed in the semiconductor body. The implantation depth of the ions injected into the semiconductor body can be controlled by control of the beam energy. The ion implantation depth just under the amorphous layer can be determined by the thickness of this layer (the amorphous layer) which can be also determined by the beam energy, thus each portion of the PN-junction can have a desired depth. Therefore, the application of this invention to the manufacture of a transistor solves the neck of the emitter dip phenomenon and provides a transistor having excellently improved electrical characteristics. The above-mentioned technique may be applied to a semiconductor integrated circuit, where a portion of the current path surrounded by a PN-junction in the semiconductor substrate can be locally narrowed to form a resistance element.

We claim:

1. A method for producing a semiconductor device having a PN-junction comprising:

a. directing a first ion beam of inert element to one surface of a semiconductor single-crystal body of a first conductivity type at a first predetermined surface area from such a direction that the directed inert ions are provided with no channeling effect in the semiconductor body so that a thin amorphous layer is formed at the first area of the semiconductor body surface; and b. directing a second ion beam of active impurity ions of a second conductivity type opposite to the first conductivity type to said one surface of the semiconductor body at a second area containing said first area therewithin from such a direction that the directed active ions are provided with channeling effect in the semiconductor body, thereby obtaining a second conductivity-type region within the semiconductor body with a PN-junction therebetween which has a partial projection at its bottom face.

2. A method for producing a semiconductor device having a PN-junction comprising:

a. forming on one surface of a semiconductor single crystal body having a first conductivity type a first masking layer having a first aperture to expose a first surface portion of the semiconductor body therethrough;

b. directing a first ion beam of inert element to the first surface portion of the semiconductor body through the first aperture of the first masking layer from such a direction that the directed inert ions are provided with no channeling effect in the semiconductor body so that a thin amorphous layer is formed at the first surface portion of the semiconductor body;

c. forming on said one surface of the semiconductor body a second masking layer having a second aperture larger than said first aperture to expose a second surface portion of the semiconductor body therethrough, said second surface portion including said first surface portion therewithin; and d. directing a second ion beam of active impurity having a second conductivity type opposite to said first conductivity type, to said second surface portion of the semiconductor body through the second aperture of the second masking layer from such a direction that the directed active impurity ions are provided with channeling effect in the semiconductor body, whereby obtaining a second conductivity-type region within the semiconductor body with a PN-junction therebetween which has a partial projection at its bottom face.

3. A method as defined in claim 1, wherein said semiconductor body is of silicon single crystal having [110] face as said one surface; wherein said first ion beam is directed from such a direction that deviates more than 7° in angle from a perpendicular direction with respect to said one surface of the semiconductor body; and wherein said second ion beam is directed from such a direction that is within 3° in deviation angle from the perpendicular direction with respect to said one surface of the semiconductor body.

4. A method for fabricating a transistor, which comprises the steps of:

a. forming on one surface of a semiconductor single-crystal body, which forms a collector region of the transistor and has a first conductivity type, a first masking layer having a first aperture to expose a first surface portion of the semiconductor body therewithin;

b. directing a first ion beam of inert element to the first portion of the semiconductor body through the first aperture of the first masking layer from such a direction that the directed inert ions are provided with no channeling effect in the semiconductor body so that a thin amorphous layer is formed at the first surface portion of the semiconductor body;

c. forming on said one surface of the semiconductor body a second masking layer having a second aperture larger than said first aperture to expose a second surface portion of the semiconductor body therethrough, said second aperture including said first surface portion therewithin;

d. directing a second ion beam of active impurity of a second conductivity type opposite to said first conductivity type, to said second surface portion of the semiconductor body through the second aperture of the second masking layer from such a direction that the directed active impurity ions are provided with channeling effect in the semiconductor body so that a base region is formed in the body with a PN-junction therebetween which has a partial projection at its bottom face underneath said amorphous layer;

e. forming on said one surface of the semiconductor body a second masking layer having a third aperture to expose the surface portion of said amorphous layer of the semiconductor body therethrough;

f. directing a third ion beam of active impurity ions of the first conductivity type, to said amorphous layer through the third aperture of the third masking layer so that an emitter region of the transistor is formed within the base region;

g. annealing said semiconductor body to eliminate the amorphous layer and surface damages formed in the body during the directions of the ion beams; and h. providing electrodes to said emitter and base regions, respectively, whereby obtaining a transistor improved defects due to emitter dip effect.

5. A method as defined in claim 4, wherein said semiconductor body is of silicon single crystal having [110] face as said one surface; wherein said first ion beam is directed from such a direction that deviates more than 7° in angle from a perpendicular direction with respect to said one surface of the semiconductor body; and wherein said second ion beam is directed from such a direction that is within 3° in deviation angle from the perpendicular direction with respect to said one surface of the semiconductor body.

* * * * *

UNITED STATES PATENT OFFICE
CERTIFICATE OF CORRECTION

Patent No. 3,615,875 Dated October 26, 1971

Inventor(s) Tadahisa Morita, Takashi Tokuyama, Takashi Tsuchimoto, Takao Miyazaki, Shigeru Nishimatsu, Takahide Ikeda It is certified that error appears in the above-identified patent and that said Letters Patent are hereby corrected as shown below:

Page 1, column 1, line 16, 40/70136 should read

--43/70136 --

Page 1, column 1, line 1, Todahisa should read

--Tadahisa --

Signed and sealed this 25th day of April 1972.

(SEAL)
Attest:

EDWARD M.FLETCHER, JR.
Attesting Officer

ROBERT GOTTSCHALK
Commissioner of Patents